United States Patent [19]
Chapman et al.

[11] Patent Number: 6,118,161
[45] Date of Patent: Sep. 12, 2000

[54] SELF-ALIGNED TRENCHED-CHANNEL LATERAL-CURRENT-FLOW TRANSISTOR

[75] Inventors: Richard A. Chapman, Dallas; Theodore W. Houston; Keith A. Joyner, both of Richardson, all of Tex.

[73] Assignee: Texas Instruments Incorporated, Dallas, Tex.

[21] Appl. No.: 09/069,569

[22] Filed: Apr. 29, 1998

Related U.S. Application Data

[60] Provisional application No. 60/045,115, Apr. 30, 1997.

[51] Int. Cl.[7] .................................................. H01L 29/78
[52] U.S. Cl. .......................................... 257/401; 257/333
[58] Field of Search .................................. 257/401, 333, 257/393

[56] References Cited

U.S. PATENT DOCUMENTS

| | | | |
|---|---|---|---|
| 4,996,574 | 2/1991 | Shirasaki | 257/401 |
| 5,115,289 | 5/1992 | Hisamoto et al. | 257/401 |
| 5,757,038 | 5/1998 | Tiwari et al. | 257/192 |

*Primary Examiner*—Donald L. Monin, Jr.
*Attorney, Agent, or Firm*—Jacqueline J. Garner; W. James Brady, III; Frederick J. Telecky, Jr.

[57] ABSTRACT

A transistor (100) having a strip channel or channels (108) in which the current flow in is the lateral direction between source (110) and drain (112). The gate (116) is located on the sidewalls and, if desired, the top of the strip channel (108). In a preferred embodiment of the invention, a disposable gate process is used that allows the source (110) and drain (112) regions to be self-aligned to the gate (116).

8 Claims, 7 Drawing Sheets

_SELF-ALIGNED TRENCHED-CHANNEL LATERAL-CURRENT-FLOW TRANSISTOR_

This application claims priority under 35 USC § 119 (e) (1) of provisional application No. 60/045,115, filed Apr. 30, 1997.

FIELD OF THE INVENTION

This invention generally relates to semiconductor devices and processes and more specifically to transistors having a gate on more than one side of the channel.

BACKGROUND OF THE INVENTION

As semiconductor devices continue to shrink into the submicron range, it becomes more and more difficult to maintain device performance. For example, in a MOSFET, current flows along the surface between the gate insulator and the silicon channel. The bulk of the channel does not contribute to the MOSFET current for gate voltage values well above the threshold voltage. As MOSFETS shrink, the surface area available for current flow naturally also shrinks.

Figure 1:
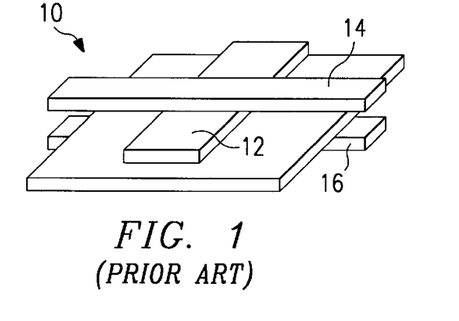
FIG. 1 is a three-dimensional diagram of a prior art double-gate MOSFET.
Figure 2:
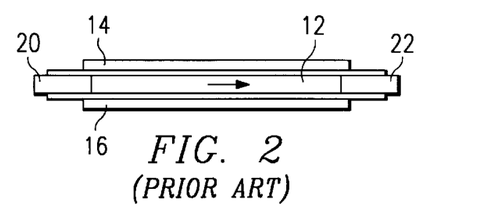
FIG. 2 is a cross-sectional diagram of the prior art double gate MOSFET of FIG. 1 from source to drain.
Figure 3:
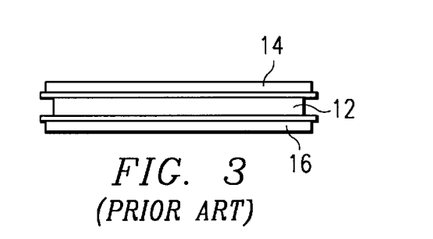
FIG. 3 is a cross-sectional diagram of the prior art double gate MOSFET of FIG. 1 across the channel.
Figure 4:
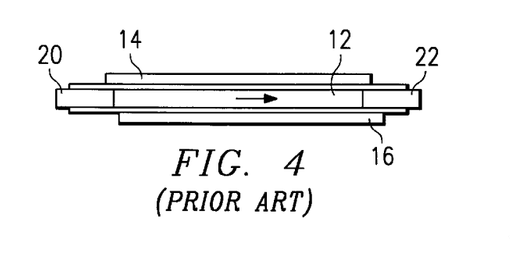
FIG. 4 is a cross-sectional diagram of the prior art double gate MOSFET of FIG. 1 from source to drain with a mis-aligned gate.

One prior art structure that has been developed to increase MOSFET conduction is a double gate SOI design. A double-gate MOSFET 10 is shown in FIG. 1. The lightly doped conducting channel 12 has a gate 14 on top of the channel 12 and a gate 16 on the bottom of the channel. In the fully depleted mode of operation, the channel is thin and lightly doped so that the combination of the two gate voltages completely depletes the silicon channel 12 from top to bottom. Although most of the current flows near the top and bottom surfaces of the channel 12, inversion charge also flows in the volume of the thin fully-depleted channel for the case just above threshold voltage. The channel may be several tens of nanometers thick for a fully depleted double gate SOI transistor. One of the most significant fabrication problems occurs in aligning the top gate pattern to the bottom gate. FIG. 2 shows a cross-section of a double gate MOSFET from source 20 to drain 22 showing the current flow. FIG. 3 shows a different cross-section across the channel 12 looking from the drain 22. FIG. 4 is the same view as FIG. 2 but with the top gate mis-aligned with respect to the bottom gate.

Figure 5:
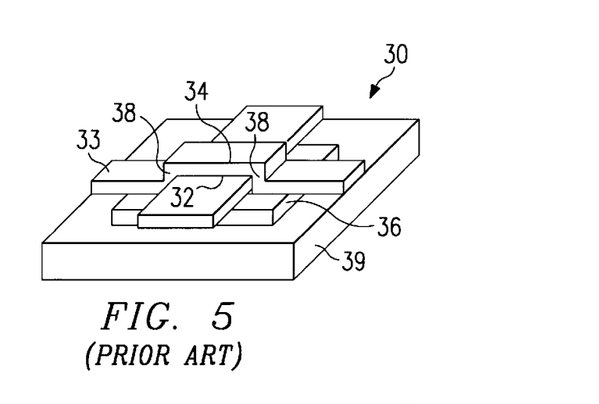
FIG. 5 is a three-dimensional diagram of a prior art SOI "Gate-All-Around" MOSFET.

Another prior art structure is the "Gate all-around" MOSFET 30 shown in FIG. 5. In MOSFET 30, the channel 32 is surrounded by gate 33. Gate 33 consists of a top gate portion 34 and a bottom gate portion 36 as in the double gate MOSFET, but also includes a gate portion 38 on the vertical edges on the channel 32. The bottom 36 and top 34 gates are joined by etching a cavity in the buried oxide 39 below the channel silicon and then (after growing the gate oxide) depositing LPCVD polysilicon gate material into the cavity and over the channel 32 in one step.

Figure 6:
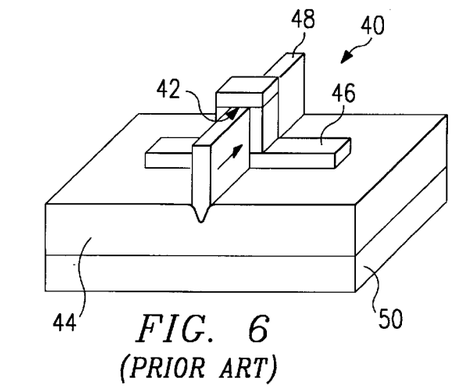
FIG. 6 is a three-dimensional diagram of a prior art vertical structure MOSFET.

Another prior art structure is the vertical SOI Delta structure 40 as shown in FIG. 6. The vertically oriented channel 42 is built over bulk silicon by forming the silicon strip 48 covered on top and sides by nitride and then this strip 48 is separated from the silicon substrate by a LOCOS oxidation 44 that extends below the silicon strip 48. A gate 46 is then formed over the channel 42. Unfortunately, this structure does not permit a large area channel, source, or drain because such a larger area would prevent the LOCOS oxide 44 from completely separating the top silicon from the substrate 50. Larger area source and drain are needed for placement of contacts and for probing pads.

Figure 7:
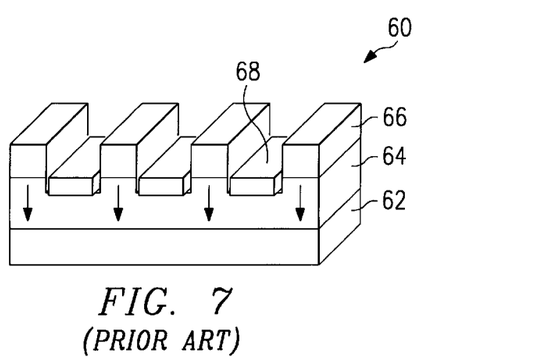
FIG. 7 is a three-dimensional diagram of a prior art permeable base transistor having the component parts of a MESFET.

Another prior art technique is an etched groove silicon permeable base transistor, shown in FIG. 7. It has the component parts of a MESFET. A MESFET differs from a MOSFET by not having a gate insulator, having a gate material that forms a Schottky barrier diode with the channel, and having a channel, source, and drain of the same conductivity type. The device of FIG. 7 is however a unipolar device with current flowing vertically down the volume of silicon strips and sharing a common drain with the substrate.

SUMMARY OF THE INVENTION

The invention described herein is a transistor having at least one strip channel in which the current flow is in the lateral direction between source and drain. The gate is located on the vertical sides and, if desired, the top of the strip channel. In a preferred embodiment of the invention, a disposable gate process is used that allows the source and drain regions to be self-aligned to the gate.

An advantage of the invention is providing a transistor in which increases the surface area between the gate or gate insulator and channel thus increasing conduction by allowing the inversion current to flow laterally along vertical surfaces between source and drain.

Another advantage of the invention is providing a transistor that has reduced short channel drain induced barrier lowering.

Another advantage of the invention is providing a transistor that has uniform gate overlap of source and drain.

These and other advantages will be apparent to those of ordinary skill in the art having reference to the specification in conjunction with the drawings and claims.

DETAILED DESCRIPTION OF PREFERRED EMBODIMENTS

The invention will be described in conjunction with a MOSFET transistor built on an SOI substrate. It will be apparent to those of ordinary skill in the art that the invention may be applied to other devices and formed on other substrates. For example, the invention may be applied to a MESFET and/or formed in a lightly doped epitaxial layer over a more heavily doped bulk silicon substrate.

Figure 8:
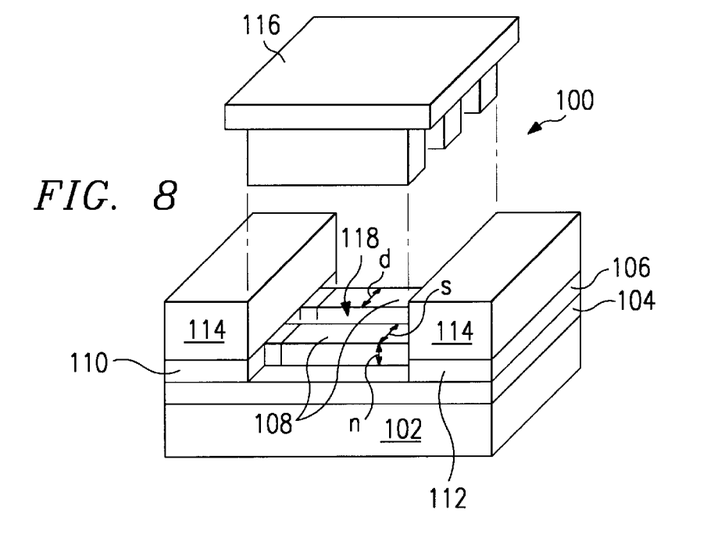
FIG. 8 is a three dimensional diagram of a trenched-channel lateral current flow transistors according to an embodiment of the invention.

A MOSFET 100 having a strip channel and lateral current flow according to the invention is shown in FIG. 8. In FIG. 8, the gate 116 is shown as lifted off of the channel 108 for ease of viewing. MOSFET 100 is formed on an SOI substrate comprising a silicon substrate 102, buried oxide 104, and a silicon layer 106. Silicon layer 106 is used to form channel region strips 108, source regions 110, and drain regions 112. Of course, other types of conductive or composite substrates may alternatively be used.

MOSFET 100 comprises several channel regions strips 108. In contrast to several prior art techniques, while the channel strips 108 of the invention are narrow, the source/drain regions 110–112 are not. Channel strips 108 have a high aspect ratio (i.e., the height, h, is greater than the strip thickness, s as shown in FIG. 8) that may be on the order of 5:1. Preferably, the aspect ratio is greater than 2:1. Channel strips 108 are lightly doped relative to the source and drain regions 110 and 112. The length and number of channel strips 108 used depends on the desired transistor size and performance required. For a transistor with strip channels according to the invention to have drive current larger than that of a standard bulk CMOS transistor, the thickness, h, of the SOI silicon to be etched into strips must be greater than one-half the sum of the strip thickness, s, and the slot thickness, d, such that $h>(d+s)/2$. For a transistor with vertical strip channels to have drive current larger than that for a double gate transistor, this relationship is changed to $h>(d+s)$. The minimum thickness of channel strips 108 is limited by lithography. Using current deep UV lithography, channel strips 108 can be as narrow as 200 nm. This width can be further narrowed (and the slots 118 widened) by using an isotropic over-etch of the resist and/or a disposable gate process. Using e-beam techniques or a combination of e-beam and deep UV techniques, the strips 108 and slots 118 could be even further narrowed. A minimal width for strips 108 is preferred to allow depletion across the channel strips 108. As an example, the width of strips 108 may be less than 20 nm and the width of slots 118 may be less than 200 nm.

A gate insulator and gate electrode, shown collectively as gate 116, are located over the channel regions strips 108 and in slots 118 that run between channel region strips 108. Accordingly, a gate is formed on the vertical sides of channel strips 108 as well as on top of channel strips 108. FIG. 8 shows a T-gate structure in which a portion of gate 116 extends over the source and drain regions and is separated from the source and drain regions by a dielectric layer 114. Dielectric layer 114 may comprise silicon dioxide or some other dielectric material known for use in interlevel dielectrics, such as BPSG.

Due to the fact that channel strips 108 are lightly doped and thin and the fact that the gate 116 is also located on the vertical sides of the channel strips 108, depletion may easily reach across each channel strip 108. The inversion current flows laterally along the many vertical surfaces connecting source and drain. (The top surface of channel strips 108 may also contribute to conduction.) The presence of gate 116 in closely spaced slots 118 has a shielding effect on the thin channel strips 108 that greatly reduces the control of the source potential by the drain voltage (reduced short channel DIBL).

Figure 9:
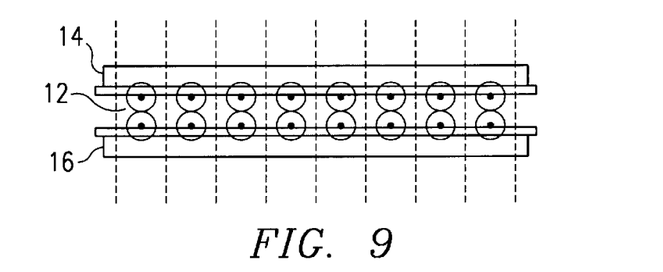
FIG. 9 is a cross-sectional diagram of a double gate MOSFET with divide lines indicating cuts for slots and arrows indicating current flow.
Figure 10:
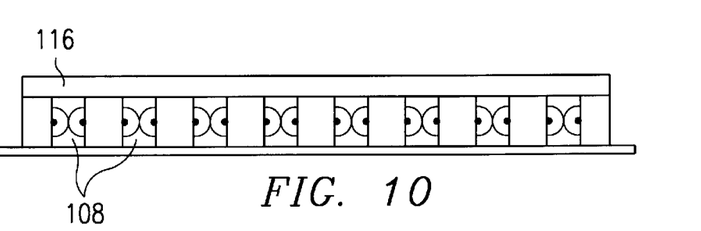
FIG. 10 is a cross-sectional diagram of a transistor of FIG. 8 with current flow arrows.
Figure 11:
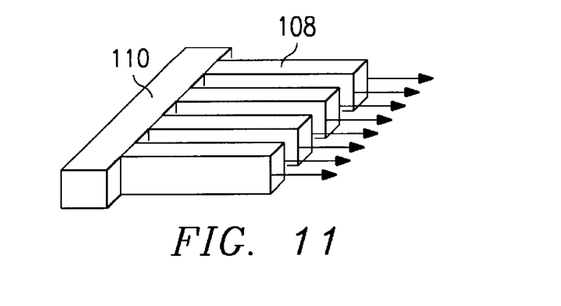
FIG. 11 is a three-dimensional view of the source region and channel strips of the transistor of FIG. 8 with arrows indicating current flow.
Figure 12:
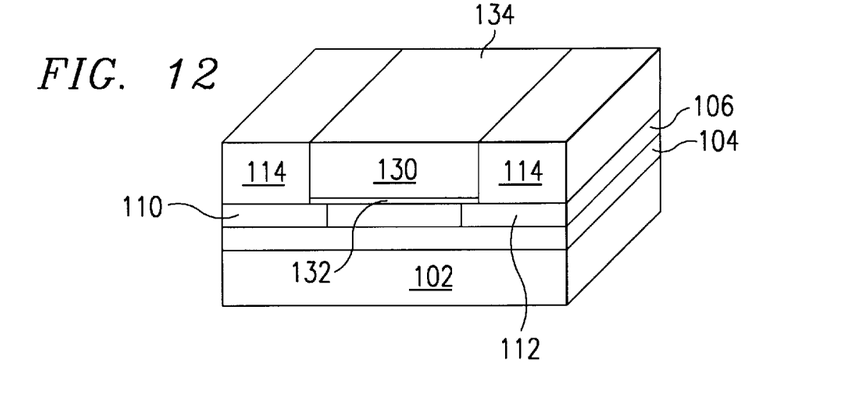
FIGS. 12–25 are three-dimensional diagrams of the transistor of FIG. 8 at various stages of fabrication.

The invention will now be compared to the SOI double-gate MOSFET (discussed above). FIG. 9 shows a cross-section of a SOI double gate MOSFET with dashed lines cutting the channel and gates into strips. If these strips are then each rotated by 90° to place the strips on end, the structure becomes similar to the invention. FIG. 10 shows the strips (108) rotated and separated by gate material 116 according to the invention. Each strip 108 is still connected to the source and drain at the ends. In both FIGS. 9&10, the circles with central dots represent the heads of arrows showing the direction of current flow. The lateral direction of current flow remains the same. However, the current which formerly flowed laterally along the surface parallel to the substrate now flows laterally in surfaces perpendicular to the substrate. This is further illustrated in FIG. 11 which shows only the source region and four channel strips. The arrows indicate current flow. As can be seen, current flow is along the vertical sides and top of the channel strips 108. Although four channel strips are shown in FIG. 11, the number of channel strips 108 may be varied. Depending on lithography, many more of the strips can be included in the invention.

For good performance of the MOSFET 100, it is desired that the source and drain implants be self-aligned to the gate and that the etched slots also be self-aligned to the source and drain. For low series resistance and consistent high performance, the gate of the MOSFET 100 should slightly overlap the source and drain in a controlled manner. A process for accomplishing this will be described hereinbelow.

It is also useful if the vertical walls of the channel strips 108 were generic {100} silicon surfaces. This can be accomplished for silicon wafers (100) by orienting the slots with respect to the usual (110) wafer flat to create either (010) or (001) surfaces for the vertical walls of the channel strips.

Silicon {111} surfaces are not etched by orientation dependent etching (ODE). In another embodiment, silicon {110} wafers could be used and the slot pattern oriented to make the vertical walls of the channel strips be {111} surfaces.

A method for forming MOSFET 100 according to the invention will now be described with reference to FIGS. 12–25. MOSFET 100 will be described as being formed in a lightly doped silicon layer 106 over a buried oxide 104 of an SOI substrate 102. However, other substrates, such as a lightly-doped epitaxial silicon layer over a heavily-doped bulk silicon substrate, may alternatively be used. The area where the channel region MOSFET 100 is to be formed should be lightly doped. The formation of MOSFET 100 will be described first, followed by a description for forming isolation for MOSFET 100.

First, a disposable gate 134 is formed over a lightly doped semiconductor layer 106. Several suitable disposable gate processes are known in the art and may be used to form disposable gate 134 for MOSFET 100. In a disposable gate process, an initial gate stack of either polysilicon over pad oxide or, preferably, nitride 130 over pad oxide 132 (or other combinations of two materials with different etching characteristics) is formed, patterned using a disposable gate pattern, and anisotropically etched to form a disposable gate 134 in the area where the final gate is to be formed. Next, source 110 and drain 112 regions are formed. For example, the source 110 and drain 112 regions may be implanted using the disposable gate as an implant block, or, the source 110 and drain 112 regions may be raised source/drain formed by selective doped epitaxial deposition of silicon. After the source 110 and drain 112 regions are formed and at least partially annealed, an interlevel dielectric 114 is formed. For example, an oxide may be deposited at a relatively low temperature (e.g., 700° C. or lower) and chemical-mechanical polishing (CMP) may be used to uncover the tops of disposable gate 134. The result in shown in FIG. 12. Because of lateral straggle during implant of the source/drain regions 110–112 and/or diffusion during anneal, the disposable gate 134 slightly overlaps the source and drain 110–112. This same overlap occurs even when raised epitaxial deposited source/drains are used because of dopant out-diffusion from the doped epitaxial silicon layer.

Figure 13:
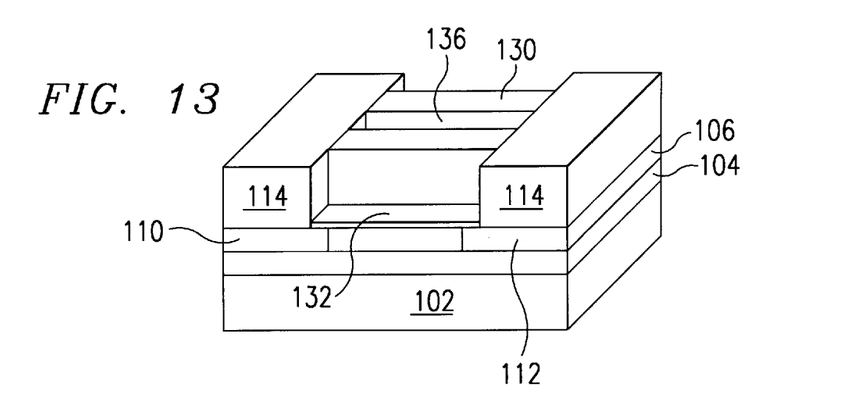
Figure 14:
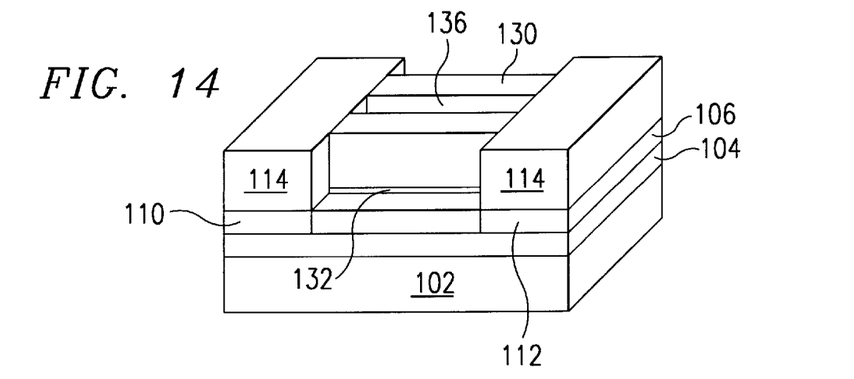

After the formation of interlevel dielectric 114, a slot pattern for forming lateral slots and strips is formed, for example with photoresist and then nitride slots 136 are etched into the nitride layer 130 of disposable gate 134. The etch stops on pad oxide 132. This is shown in FIG. 13. Although the pattern is still in place it is not shown in FIG. 13 for ease of viewing the nitride slots 136 in nitride layer 130. The next step is to etch away the pad oxide 132 at the bottom of the slots 136, as shown in FIG. 14. After the exposed pad oxide 132 is removed, the slot pattern is also removed.

Figure 15:
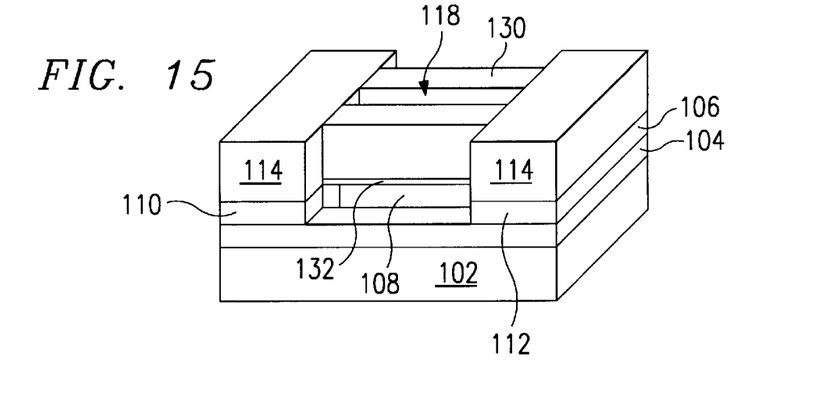

FIG. 15 shows MOSFET 100 after a silicon slot etch has been performed to etch the silicon layer 106 above the SOI buried oxide layer 104. (If a lightly doped epitaxial silicon layer formed over a heavily doped silicon substrate is used instead of an SOI substrate, the silicon slot etch would not automatically stop at the heavily doped substrate, but extend slightly into the heavily doped substrate. In this case, the substrate would add gate-to-substrate capacitance but very little source-to-drain inversion current because Vt in the heavily doped region would be too high.) The silicon slot etch forms multiple channel strips 108 separated by slots 118.

Note that there is a small amount of source 110 and drain 112 at the two ends of each channel strip 108. This is needed for low series resistance MOSFETs. It is extremely important, however, that the amount of overlap be uniform. A process should be used that minimizes variability. Using a disposable gate process results in little variability from device to device because the source/drain regions 110–112 are formed in a self-aligned manner to the disposable gate 134. If the slots had instead been patterned and etched before the gate and without a disposable gate process, the gate overlap of source and drain would be highly variable due to misalignment of the gate pattern to the separate slot pattern.

Figure 16:
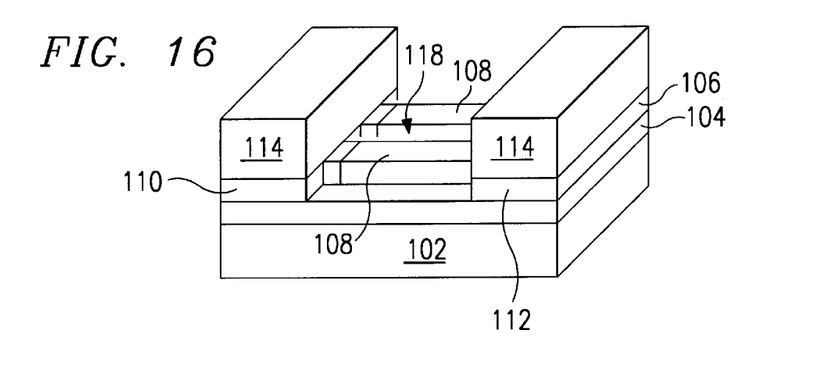

FIG. 16 shows the structure after the remaining portions of disposable gate 134 has been removed. If a nitride disposable gate was used, then a hot phosphoric acid with some sulfuric acid added to the solution can be used to remove the nitride without attacking the silicon or oxide. Alternatively, the nitride could be left in place on top of the channel even through gate deposition. This would prevent the formation of a top gate over the channel strips 108 and there may be situations where a top gate is not desired. After the nitride is removed the pad oxide 132 may be removed using a short deglaze. It should be noted that if a polysilicon disposable gate were used, it might be difficult to remove the disposable gate without damaging the remaining structure.

Figure 17:
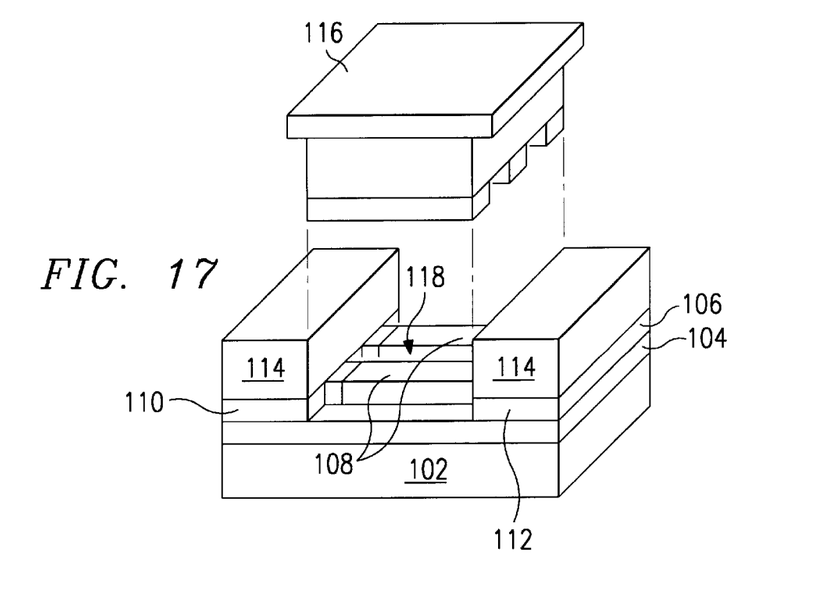

FIG. 17 shows the MOSFET 100 after completion of the gate 116 (silicidation of the gate and multi-level metallization are not included). First, a gate oxide is grown and then gate material is deposited into the slots 118 and over channel strips 108. The gate material may, for example, be in-situ doped polysilicon. Alternatively, a metal gate may be used, such as tungsten, TiN, WN, or aluminum. An aluminum gate over titanium-nitride (TiN) is particularly interesting because high pressure aluminum deposition or CVD aluminum could be used to form aluminum in the central gaps in the slots 118 left after partially filing the slots with a thin film of TiN. After deposition of the gate material, a gate patterning is used to etch the final gate 116. The gate etch stops on the relatively thick dielectric layer 114 over the source and drain 110–112 and over the isolation (not shown) between transistors. This final gate patterning may have wider patterns than the distance between the source and drain 110–112, thus forming a "T-gate" structure as viewed in a cross-section through the channel from source to drain. FIG. 17 shows a "T-gate" structure.

Figure 18:
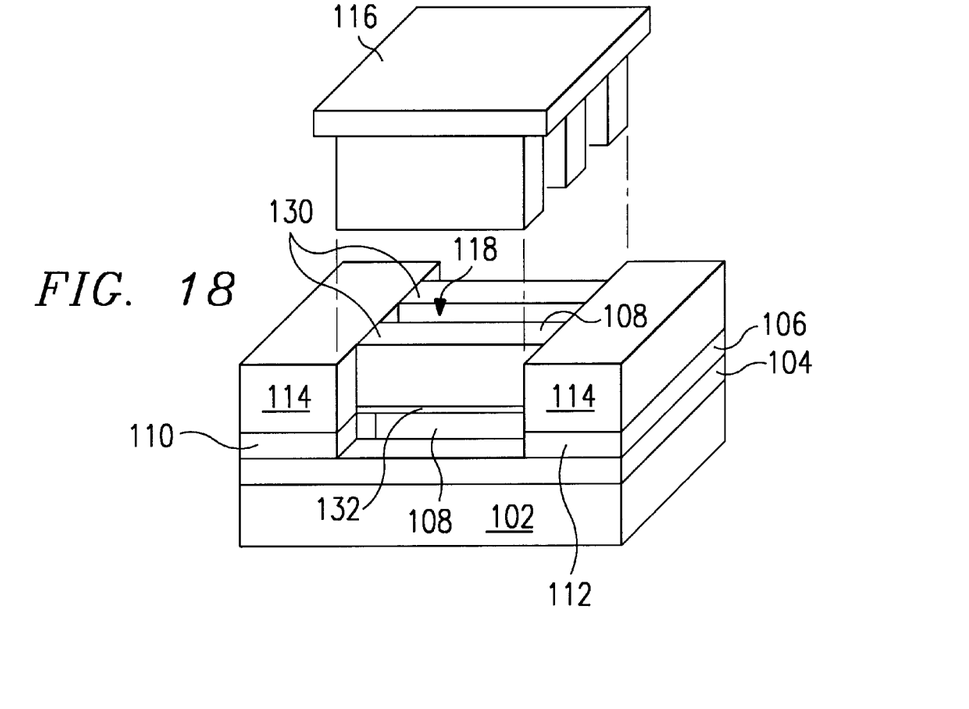

If there is a problem with sharp edged between the vertical sides and the top side of the channel strips 108, a sacrificial oxide may be grown to round the corners. This, however, could present another problem because the source and drain diffusions are already in place in the disposable gate process and growing a sacrificial oxide could increase the source/drain junction depths thus producing excessive gate/drain overlap because of too much heat treatment. This is an example of a case where a top gate is not desired. Thus, the optional step described above for leaving nitride on top of the channel strips 108 may be used to prevent a top gate. If the nitride strips are kept in place, the strips and slots on the bottom surface of the gate will become deeper to match the deeper slots on the silicon-slots which now go past nitride, pad oxide, and silicon channel rather than just past the silicon channel 108. FIG. 18 shows an embodiment with the nitride strips 130 in place. Alternatively, a direct nitridation process could be performed before pad oxide and the disposable gate process. In this case, the pad deglaze would not remove the nitride layer formed by direction nitridation.

Figure 19:
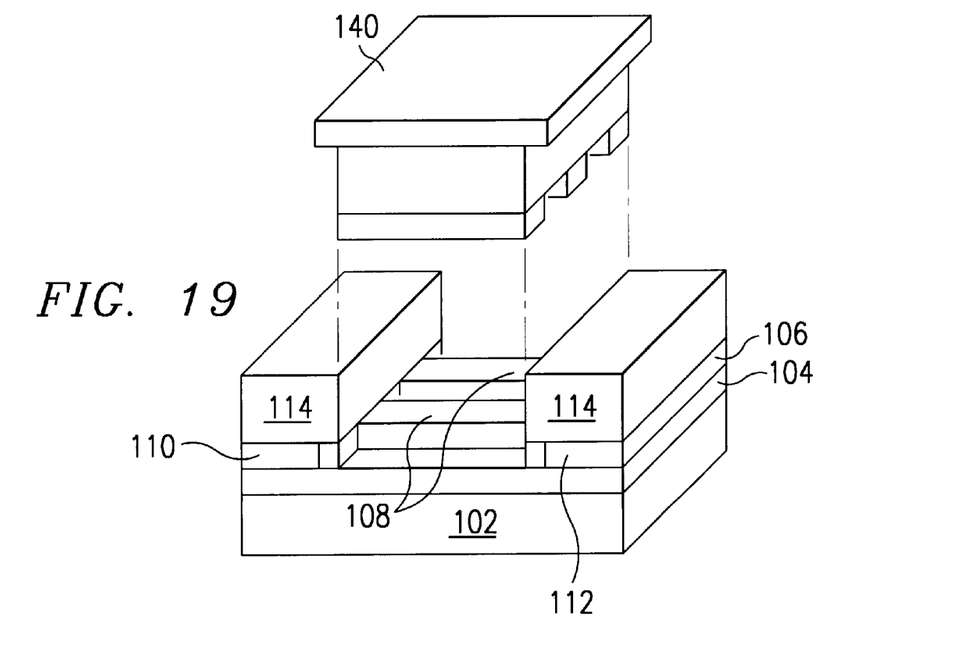

In another embodiment, the invention may be applied to a MESFET. By changing the above embodiment to having a source/drain, and channel all of the same doping type and concentration and replacing the gate 116 (including the gate insulator) with a Schottky barrier electrode 140, a MESFET may be formed. Better performance may be obtained by increasing the dopant concentration in the source and drain (but still using the same dopant type as the channel). A MESFET permeable base transistor is shown in FIG. 19. In FIG. 19, the heavily doped source and drain regions 110–112 are spaced away from the gate in order to prevent breakdown at low gate voltages.

Figure 20:
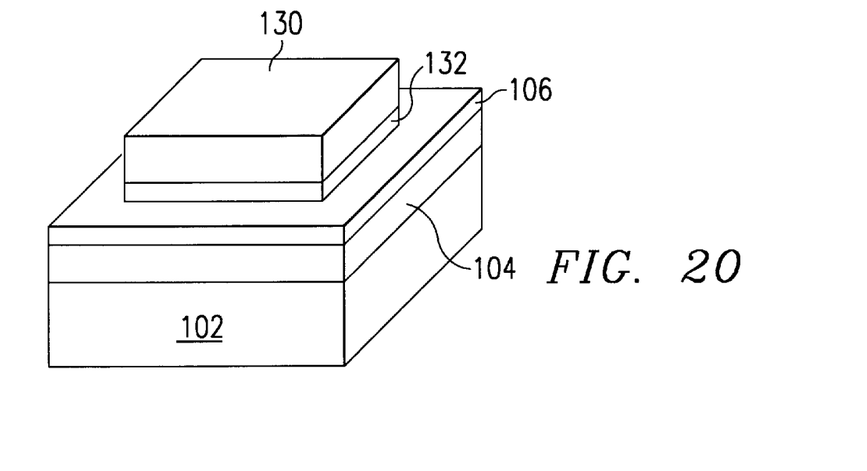
Figure 21:
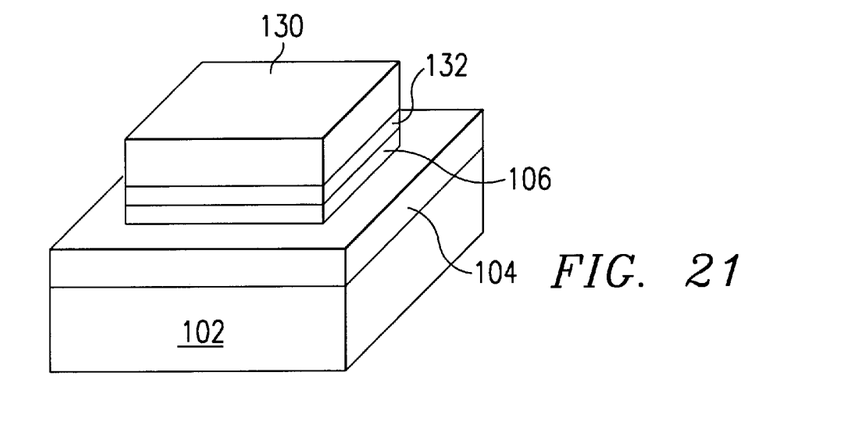

A method for forming isolation between transistors formed according to the invention will now be described. First, the disposable gate materials are deposited as described above in the first embodiment. For example, the nitride 130 and pad oxide 132 are deposited on top of the lightly doped semiconductor layer 106 (in this case, the top silicon layer over a buried oxide of a SOI substrate). An active area pattern and etch step is then added to pattern and etch the nitride 130 and pad oxide 132 so that they cover what will become the active area for the transistors. This is shown in FIG. 20. Referring to FIG. 21, the nitride 130 and pad oxide 132 are then used as a hardmask for etching the lightly doped semiconductor layer 106. Only the active area of lightly doped semiconductor layer remains.

Figure 22:
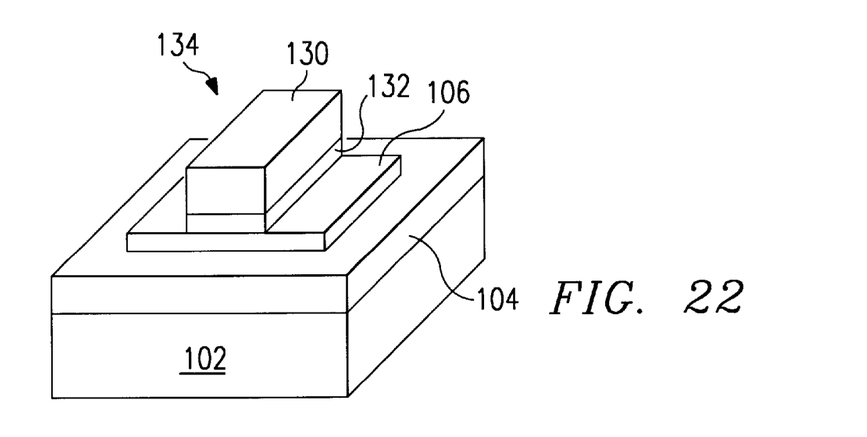
Figure 23:
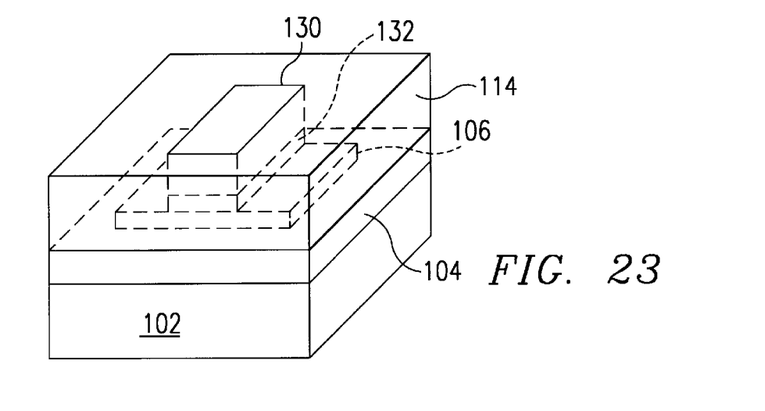
Figure 24:
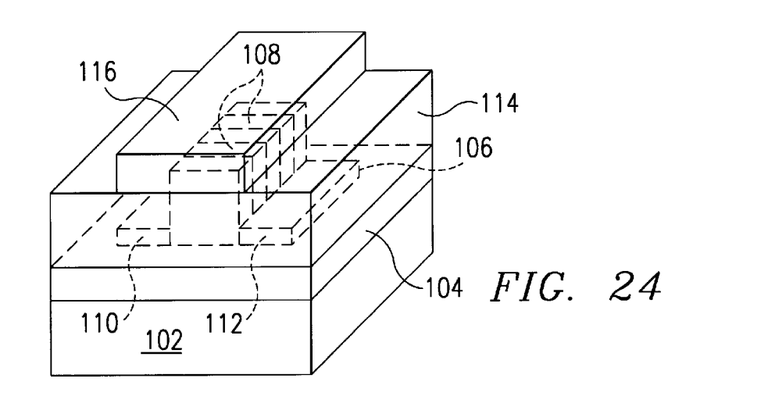

Next, a disposable gate pattern as described above is used to etch the nitride 130 and pad oxide 132 to form the disposable gate 134, as shown in FIG. 22. Next, the dielectric layer 114 is deposited and planarized by CMP to expose the top of the disposable gate 134. The formation of dielectric layer 114 was included in the first embodiment. However, as FIG. 23 indicates, with portions of lightly doped semiconductor layer removed, dielectric layer 114 is also formed directly over the buried oxide in the non-active areas of the device. Thus, dielectric layer 114 also serves to isolate transistors 100 from one another. The remaining steps are the same as described above. The MOSFET 100 with isolation is shown in FIG. 24.

Figure 25:
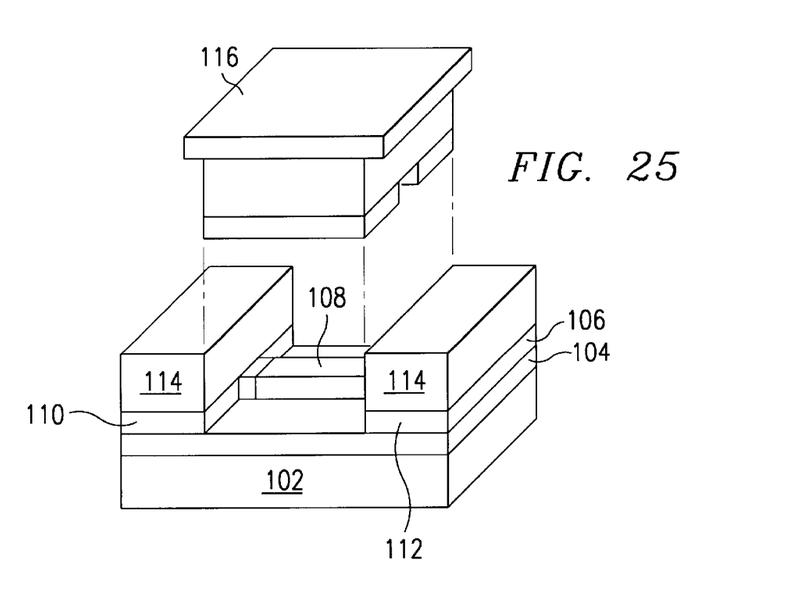

Although multiple channel strips are described above, the invention is also applicable to a single channel strip as shown in FIG. 25. FIG. 25 shows a single channel strips 108 with a gate 116 self-aligned to the source and drain 110–112 that are greater in width than the channel. Using a disposable gate/self-aligned process as described above, it is not necessary to pattern and etch gate material directly over a channel strip as is the case with the prior art structures of FIG. 5 and FIG. 6. A highly anisotropic etch would need to be used to define a gate to give vertical sides to the gate strip. When etching over a topographical step such as that, a sidewall of gate material may be left on the side of the topography after the anisotropic etch. Referring to the prior structure of FIG. 6, the anisotropic etch would leave gate material stringers or sidewalls along the steep walls of the areas where source and drain are desired. An extra patterning step would have to be performed to remove these stringers or sidewalls. Instead, in the embodiments of the invention, the slot or slots 118 are formed and then filled with gate material. The gate material is then etched to form the gate, but this etch does not etch into the slots. Therefore, there is no problem with unwanted sidewalls of gate material being formed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transistor comprising;

a source region;

a drain region;

at least one channel strip extending between said source and drain region, said channel strip being narrower than said source and drain regions, said channel strip region having an aspect ratio of greater than 2; and a gate extending over said at least one channel strip and along sidewalls of said at least one channel strip, wherein said gate overlaps a portion of said source region and a portion of said drain region.

2. The transistor of claim 1, wherein said aspect ratio is on the order of 5:1.

3. The transistor of claim 1, wherein said gate comprises a gate insulator and a gate electrode.

4. The transistor of claim 1, further comprising a dielectric layer on a surface of said at least one channel strip between said at least one channel strip and said gate.

5. The transistor of claim 1, wherein said gate forms a T-gate structure.

6. A transistor comprising;

a source region;

a drain region;

at least one channel strip extending between said source and drain region, said channel strip being narrower than said source and drain regions, said channel strip region having an aspect ratio of greater than 2;

a dielectric layer on a top surface of said at least one channel strip;

a gate dielectric along sidewalls of said at least one channel strip, said gate dielectric having a different dielectric material than said dielectric layer; and a gate electrode extending over said dielectric layer and said gate dielectric, said gate electrode being separated from said top surface of said at least one channel strip by said dielectric layer and separated from sidewalls of said at least one channel strip by said gate dielectric.

7. The transistor of claim 6, wherein said dielectric layer comprises nitride.

8. A transistor comprising;

a source region;

a drain region;

at least one channel strip extending between said source and drain region, said channel strip being narrower than said source and drain regions, said channel strip region having an aspect ratio of greater than 2; and a gate extending over said at least one channel strip and along sidewalls of said at least one channel strip, wherein said gate forms a Schottky barrier diode with said at least on channel strip.

* * * * *